(12) United States Patent
Mori et al.

(10) Patent No.: US 10,146,115 B2
(45) Date of Patent: Dec. 4, 2018

(54) WAVELENGTH CONVERTER, PROJECTOR, AND LIGHTING DEVICE

(71) Applicant: PANASONIC INTELLECTUAL PROPERTY MANAGEMENT CO., LTD., Osaka (JP)

(72) Inventors: Toshio Mori, Kyoto (JP); Ran Zheng, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/838,155

(22) Filed: Dec. 11, 2017

(65) Prior Publication Data

US 2018/0173085 A1    Jun. 21, 2018

(30) Foreign Application Priority Data

Dec. 19, 2016   (JP) ................ 2016-245049

(51) Int. Cl.

| G03B 21/20 | (2006.01) |
|---|---|
| H01L 33/46 | (2010.01) |
| F21V 7/22 | (2018.01) |
| H01L 33/50 | (2010.01) |
| F21K 9/64 | (2016.01) |
| F21V 9/30 | (2018.01) |
| F21Y 115/30 | (2016.01) |
| F21Y 115/10 | (2016.01) |

(52) U.S. Cl.
CPC .............. *G03B 21/204* (2013.01); *F21K 9/64* (2016.08); *F21V 7/22* (2013.01); *F21V 9/30* (2018.02); *H01L 33/46* (2013.01); *H01L 33/50* (2013.01); *F21Y 2115/10* (2016.08); *F21Y 2115/30* (2016.08); *H01L 2933/0041* (2013.01)

(58) Field of Classification Search
CPC .... G03B 21/005; G03B 21/14; G03B 21/204; F21V 13/08; F21V 13/10; F21V 13/14; F21S 10/02; F21S 10/007; F21S 10/0023; F21S 10/0026
See application file for complete search history.

(56) References Cited

U.S. PATENT DOCUMENTS

| 2005/0276912 | A1* | 12/2005 | Yamamoto | H01L 21/28008 427/117 |
|---|---|---|---|---|
| 2010/0320479 | A1* | 12/2010 | Minato | H01L 33/505 257/88 |
| 2011/0116253 | A1* | 5/2011 | Sugiyama | F21S 10/007 362/84 |
| 2011/0304830 | A1 | 12/2011 | Kato et al. | |
| 2013/0286633 | A1* | 10/2013 | Rodriguez | H01L 33/50 362/84 |
| 2014/0140038 | A1* | 5/2014 | Gerets | G03B 21/16 362/84 |
| 2015/0204517 | A1* | 7/2015 | Arakawa | G03B 21/204 353/84 |

FOREIGN PATENT DOCUMENTS

JP    2011-257600 A    12/2011

* cited by examiner

*Primary Examiner* — Sultan Chowdhury
(74) *Attorney, Agent, or Firm* — McDermott Will & Emery LLP

(57) ABSTRACT

A wavelength converter includes, in sequence, a substrate, a reflective layer, and a phosphor layer. The phosphor layer contains a sealing layer and a phosphor dispersed in the sealing layer. The sealing layer is made of a hybrid material containing a glass component and a resin component.

7 Claims, 3 Drawing Sheets

WAVELENGTH CONVERTER, PROJECTOR, AND LIGHTING DEVICE

RELATED APPLICATIONS

This application claims the benefit of Japanese Application No. 2016-245049, filed on Dec. 19, 2016, the entire disclosure of which Application is incorporated by reference herein.

BACKGROUND

1. Technical Field

The present disclosure relates to a wavelength converter and also to a projector and a lighting device each including the wavelength converter.

2. Description of the Related Art

In conventional projectors and lighting devices, excitation light from a solid-state light source, such as a semiconductor laser or a light emitting diode is wavelength-converted by a phosphor layer contained in a wavelength converter, thereby producing light of desired color.

One well-known such phosphor layer is composed of a resin sealing layer and a phosphor dispersed in the layer. In a wavelength converter with such a phosphor layer, a reflective layer made of silver (Ag) or aluminum (Al) is disposed between the substrate and the phosphor layer in order to improve the light extraction efficiency of the wavelength converter.

CITATION LIST

Patent Literature

PTL 1: Japanese Unexamined Patent Application Publication No. 2011-257600

SUMMARY

Technical Problem

Phosphor layers with a resin sealing layer are more vulnerable to heat than phosphor layers with a glass sealing layer. Therefore, in order to obtain a wavelength converter with high heat resistance, it is preferable that phosphor layers should contain a glass sealing layer.

However, the reflective layer may be exposed high temperature during a process in which the phosphor layer with the glass sealing layer is formed onto the substrate with the reflective layer, and thus may decrease in reflectivity. For example, in the case of an Ag reflective layer, Ag migrates due to high temperature, causing a decrease in the reflectivity of the reflective layer. In the case of an Al reflective layer, the difference in thermal expansion coefficient between the substrate and the reflective layer causes the reflective layer to bend and to decrease in reflectivity. The decrease in the reflectivity of the reflective layer caused by these situations leads to a decrease in the light extraction efficiency of the wavelength converter.

An object of the present disclosure is to provide a wavelength converter with high heat resistance and high light extraction efficiency. Another object of the present disclosure is to provide a projector and a lighting device which have high heat resistance and high luminosity.

Solution to Problem

An aspect of the present disclosure is a wavelength converter including, in sequence, a substrate, and a reflective layer, and a phosphor layer. The phosphor layer contains a sealing layer and a phosphor dispersed in the sealing layer. The sealing layer is made of a hybrid material containing a glass component and a resin component.

Another aspect of the present disclosure is a projector including the above-mentioned wavelength converter.

Still another aspect of the present disclosure is a lighting device including the above-mentioned wavelength converter.

Advantageous Effects of Disclosure

The wavelength converter according to the present disclosure includes a sealing layer made of the hybrid material containing the glass component and the resin component. With this configuration, the phosphor layer is heat-resistant, and hence, the wavelength converter is heat-resistant. Furthermore, the phosphor layer can be formed at low temperature. This makes it unlikely that the reflective layer decreases in reflectivity during the formation of the phosphor layer, so that the wavelength converter has high light extraction efficiency.

The projector and the lighting device according to the present disclosure include the above-mentioned wavelength converter, and therefore, have high heat resistance and high luminosity.

DETAILED DESCRIPTION

Exemplary embodiments of a wavelength converter, a projector, and a lighting device according to the present disclosure will now be described with reference to drawings. The following embodiments are only examples, and the present disclosure is not limited to the wavelength converter, the projector, or the lighting device shown in these embodiments.

In the following exemplary embodiments, the description of well-known matter and of substantially the same configuration as described earlier may be omitted to avoid redundancy and help those skilled in the art understand them easily.

First Exemplary Embodiment

Wavelength Converter 10

Figure 1:
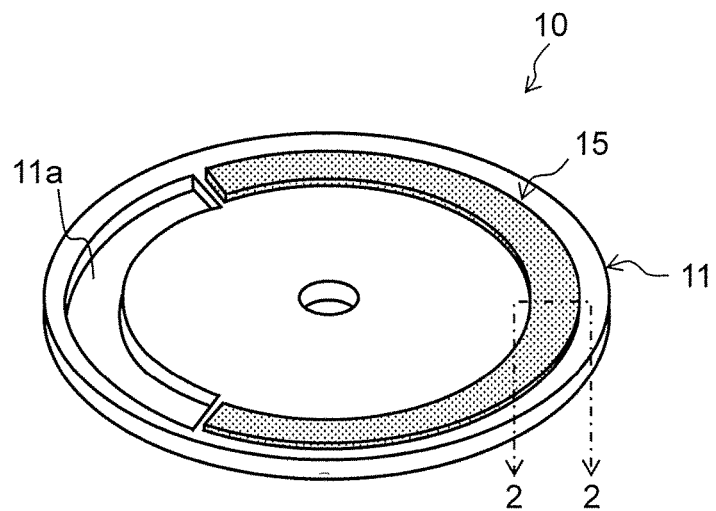
FIG. 1 is a perspective view of a wavelength converter according to a first exemplary embodiment.

FIG. 1 is a perspective view of wavelength converter 10 according to the first exemplary embodiment. In FIG. 1, wavelength converter 10 is a phosphor wheel for use in projectors, and includes disk-shaped substrate 11 and arc-shaped phosphor layer 15 on a main surface (upper surface) of substrate 11.

Substrate 11 has arc-shaped opening 11*a*. Opening 11*a* and phosphor layer 15, both are arc-shaped, together form a ring. When later-described solid-state light sources 111*a* emit excitation light to wavelength converter 10, part of the light passes through substrate 11 by way of opening 11a.

Figure 2:
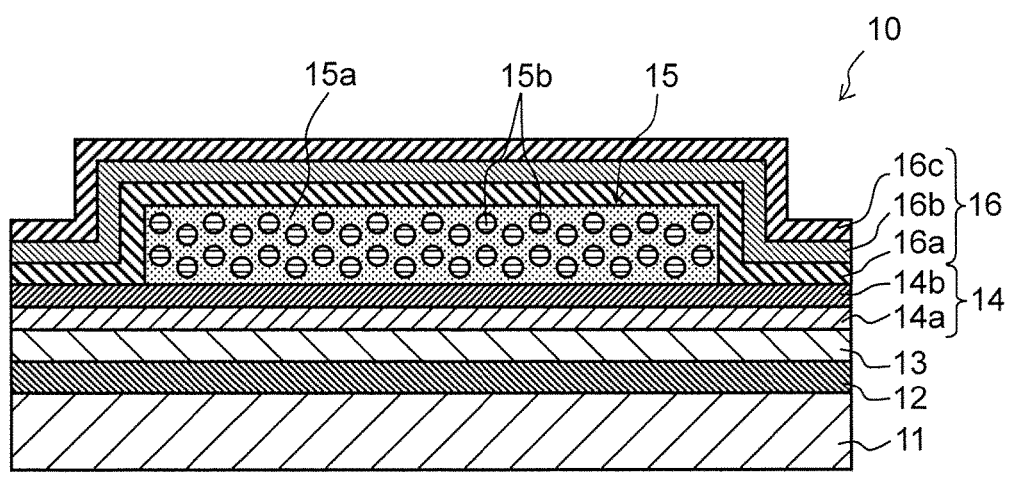
FIG. 2 is a cross sectional view of the wavelength converter according to the first exemplary embodiment taken along line 2-2 of FIG. 1.

FIG. 2 is a cross sectional view of wavelength converter 10 according to the first exemplary embodiment taken along line 2-2 of FIG. 1. As shown in FIG. 2, wavelength converter 10 includes substrate 11, adhesive layer 12, reflective layer 13, enhanced reflection layer 14, phosphor layer 15, and antireflective layer 16. These layers 12, 13, 14, 15, and 16 are formed in this order on substrate 11.

Substrate 11 has the functions of supporting phosphor layer 15 and of dissipating the heat generated in phosphor layer 15 to the outside. Examples of materials of substrate 11 include glass, quartz, gallium nitride (GaN), sapphire, silicon, and resin. Examples of the resin include polyethylene naphthalate (PEN) and polyethylene terephthalate (PET).

Adhesive layer 12 has the function of improving the adhesiveness of reflective layer 13 to substrate 11. Layer 12 is made of, for example, titanium (Ti) and is formed on the entire upper surface of substrate 11. Layer 12 is not essential in the present exemplary embodiment.

Reflective layer 13 has the function of reflecting excitation light that has passed through phosphor layer 15 and/or fluorescence emitted from phosphor layer 15 toward substrate 11 (downward) to the opposite side (upward). In the present exemplary embodiment, reflective layer 13 is made of Ag and is formed on the entire upper surface of adhesive layer 12. Alternatively, layer 13 may be made of Al or other metals; however, Ag and Al are preferable because of their high reflectivity.

Enhanced reflection layer 14 has the functions of reducing optical scattering loss in the interface between reflective layer 13 and antireflective layer 16, and of preventing a decrease in reflectivity due to the angular dependence of the incident light. Layer 14 is formed in the entire region of layer 13, or in other words, on the entire upper surface of layer 13. Layer 14 is not essential in the present exemplary embodiment.

Enhanced reflection layer 14 is a multi-layer film composed of alternately laminated low refractive layers and high refractive layers. In the present exemplary embodiment, layer 14 is composed of two layers: low refractive layer 14a and high refractive layer 14b formed in this order from the substrate 11 side. Alternatively, however, layer 14 may include additional layers besides layers 14a and 14b as long as it is a multi-layer film composed of alternately laminated low and high refractive layers.

Examples of materials of low refractive layer 14a include oxides such as silicon dioxide ($SiO_2$) and aluminum oxide ($Al_2O_3$); and nitrides such as aluminum nitride (AlN), aluminum gallium nitride (AlGaN), and aluminum indium nitride (AlInN).

Examples of materials of high refractive layer 14b include oxides such as niobium pentoxide ($Nb_2O_5$), titanium dioxide ($TiO_2$), titanium pentoxide ($Ti_3O_5$), zinc oxide (ZnO), zirconium dioxide ($ZrO_2$), tantalum pentoxide ($Ta_2O_5$), and cerium oxide ($CeO_2$); and nitrides such as aluminum oxynitride (AlON) and GaN.

Phosphor layer 15 has the function of converting the excitation light emitted from later-described solid-state light sources 111a to wavelength converter 10 into fluorescence. Phosphor layer 15 includes sealing layer 15a with light transmission properties, and particulate phosphor 15b dispersed into layer 15a.

Sealing layer 15a is made of a hybrid material containing a glass component and a resin component. This hybrid material is obtained, for example, by putting the glass component and the resin component in a polydispersed or separated state, and then by chemically combining these components. The hybrid material has both inorganic properties of a siloxane bond in the main chain and organic properties of an organic functional group in the side chain. To be more specific, the material has the property of softening at 120 to 180° C. and vitrifying when supercooled. The material also has a heat-resistance between that of glass and that of resin.

Specific examples of the glass component of the hybrid material include silica glass with a Si—O structure and phosphate glass with a P—O bond. Examples of a sole vitrifying component include $SiO_2$, $B_2O_3$, $P_2O_5$, $GeO_2$, $BeF_2$, $As_2S_3$, $SiSe_2$, and $GeS_2$.

One specific example of the resin component of the hybrid material is a silicone resin with a Si—O structure.

Phosphor layer 15 is more heat-resistant than phosphor layers with a resin sealing layer because it contains the hybrid material that contains the glass component. In order to demonstrate this fact, a heat resistance test was conducted in which a 500 μm-thick layer made of the hybrid material was heated to 250° C. in an oven. After 1000 hours of heating, the layer maintained the light transmittance at a wavelength of 450 nm.

The hybrid material, which is a component of sealing layer 15a, also contains the resin component as mentioned above. Therefore, phosphor layer 15 can be formed at a lower temperature than phosphor layers with a glass sealing layer. To be more specific, melting of glass or dehydration and condensation of silanols are conducted at 500° C. or higher, whereas the hybrid material is solidified at 200° C. or below (for example, three hours at 150° C.). Therefore, it can be prevented that reflective layer 13 made of Ag is migrated by heat, or that an Al reflective layer is bent by heat. Thus, reflective layer 13 maintains its reflectivity.

The hybrid material contains as a residue a hydrolyzed silicon alkoxide compound. This compound can be, for example, a compound with an alkoxy group, and is generated in an alcohol elimination reaction while the hybrid material is solidified by heat.

The hybrid material may be composed of the glass component and the resin component alone. Alternatively, however, the material may further contain a compound having a glass transition point. Specific examples of the compound include silane coupling agents; fillers such as silica, and mica; pigments; and antistatic agents. The hybrid material may further contain impurity levels of compounds in addition to the glass and resin components and the compound having the glass transition point.

In order to obtain a wavelength converter with high heat resistance and high light extraction efficiency, it is preferable that the hybrid material should contain at least 98 wt %of a combination of the glass component and the resin component. Furthermore, in order to reduce the optical scattering in phosphor layer 15, the refractive index of sealing layer 15a is preferably not less than 1.4, and more preferably not less than 1.7.

Phosphor 15b is composed of at least one type of phosphor that absorbs excitation light in the UV to blue light region and emits fluorescence with a longer wavelength than the excitation light. In the present exemplary embodiment, solid-state light sources 11la are semiconductor lasers for emitting blue excitation light, and phosphor 15b is composed of a yellow phosphor. Exposed to the blue excitation light, phosphor 15b emits yellow fluorescence. Phosphor 15b may be a red or green phosphor instead of the yellow one. Furthermore, phosphor 15b may be composed of different kinds of phosphors whose emission spectra have different center wavelengths.

Examples of the yellow phosphor include $Y_3Al_5O_{12}:Ce^{3+}$, $(Sr, Ba)_2SiO_4:Eu^{2+}$, and $Ca_x(Si, Al)_{12}(O, N)_{16}:Eu^{2+}$. Examples of the red phosphor include $CaAlSiN_3:Eu^{2+}$, $(Ca, Sr)AlSiN_3:Eu^{2+}$, $Ca_2Si_5N_8:Eu^{2+}$, $(Ca, Sr)_2Si_5N_8:Eu^{2+}$, $KSiF_6:Mn^{4+}$, and $KTiF_6:Mn^{4+}$. Examples of the green phosphor include $LU_3Al_5O_{12}:Ce^{3+}$, $Y_3(Ga, Al)_5O_{12}:Ce^{3+}$, $Ca_3SC_2Si_3O_{12}:Ce^{3+}$, $CaSC_2O_4:EU^{2+}$, $(Ba, Sr)_2SiO_4:Eu^{2+}$, $Ba_3Si_6O_{12}N_2:Eu^{2+}$, $(Si, Al)_6(O, N)_8:Eu^{2+}$, and $(Y, Lu)_3Al_5O_{12}:Ce^{3+}$.

Antireflective layer 16 has the function of reducing the reflection of the excitation light incident on layer 15, thereby improving the incident efficiency of the light on layer 15. Layer 16 further has the function of reducing the reflection of the fluorescence emitted from phosphor 15b on the surface of sealing layer 15a, thereby improving the extraction efficiency of the fluorescence from layer 15. Layer 16 is not essential in the present exemplary embodiment.

Layer 16 is formed in the entire region of reflective layer 13. Layer 16 is in contact with enhanced reflection layer 14 in the region of substrate 11 that is not covered with phosphor layer 15.

Antireflective layer 16 is a multi-layer film composed of alternately laminated high refractive layers and low refractive layers. In the present exemplary embodiment, layer 16 is composed of three layers: first low-refractive layer 16a, high refractive layer 16b, and second low-refractive layer 16c in this order from the substrate 11 side. Alternatively, however, layer 16 may include additional layers besides layers 16a to 16c as long as it is a multi-layer film composed of alternately laminated low and high refractive layers.

Examples of materials of first and second low-refractive layers 16a and 16c include oxides such as $SiO_2$ and $Al_2O_3$; and nitrides such as AlN, AlGaN, and AlInN. These low-refractive layers 16a and 16c may be made of the same or different materials from each other, or may be made of the same or different materials from low refractive layer 14a of enhanced reflection layer 14.

Examples of materials of high refractive layer 16b include oxides such as $TiO_2$, $Nb_2O_5$, $Ti_3O_5$, ZnO, $ZrO_2$, $Ta_2O_5$, and $CeO_2$; and nitrides such as AlON, and GaN. High refractive layer 16b of antireflective layer 16 may be made of the same or different materials from high refractive layer 14b of enhanced reflection layer 14.

In the above-described wavelength converter 10 according to the present exemplary embodiment, sealing layer 15a is made of the hybrid material containing the glass component. As a result, phosphor layer 15 is heat-resistant, and hence, wavelength converter 10 is heat-resistant.

In wavelength converter 10 according to the present exemplary embodiment, sealing layer 15a is made of the hybrid material containing the resin component. Therefore, phosphor layer 15 can be formed at low temperature. This makes it unlikely that reflective layer 13 decreases in reflectivity during the formation of phosphor layer 15. As a result, wavelength converter 10 has high light extraction efficiency.

These facts demonstrate that wavelength converter 10 according to the present exemplary embodiment has high heat resistance and high light extraction efficiency.

Projector 100

As a projector according to the first exemplary embodiment, projector 100 including wavelength converter 10 according to the first exemplary embodiment will now be described.

Figure 3:
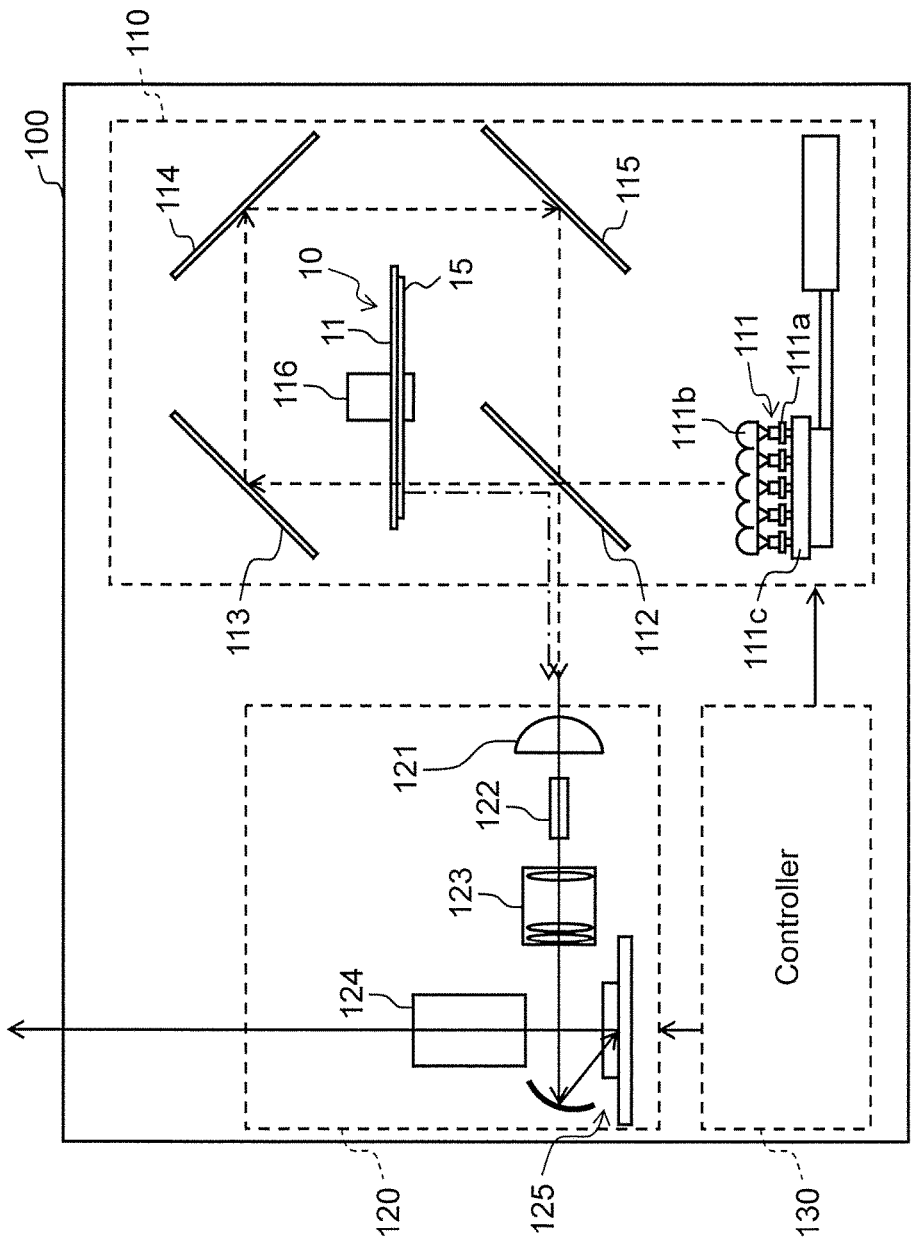
FIG. 3 is a diagram of a projector according to the first exemplary embodiment.

FIG. 3 is a diagram of projector 100 according to the first exemplary embodiment. As shown in FIG. 3, projector 100 includes light-emitting device 110, optical unit 120, and controller 130.

Light-emitting device 110 is the light source of projector 100. Device 110 includes wavelength converter 10, illuminator 111, dichroic mirror 112, first reflective mirror 113, second reflective mirror 114, and third reflective mirror 115.

Wavelength converter 10 is attached to and rotated by motor 116. Motor 116 is driven by a drive control signal from controller 130.

Illuminator 111 applies excitation light for exciting phosphor 15b to wavelength converter 10 from the phosphor layer 15 side. Illuminator 111 includes solid-state light sources 111a, and collimator lenses 111b for collimating the excitation light emitted from solid-state light sources 111a, and heat sink 111c.

Solid-state light sources 111a are, for example, semiconductor lasers or light emitting diodes. Light sources 111a are driven by a drive current and emit excitation light of predetermined color (wavelengths). In the present exemplary embodiment, light sources 111a are semiconductor lasers for emitting blue light with wavelengths between 360 nm and 480 nm, inclusive. The light emission from light sources 111a is controlled by controller 130. It is also possible to use a single light source 111a.

Dichroic mirror 112 has the property of transmitting the blue light (blue excitation light) emitted from illuminator 111, and reflecting light with a larger wavelength than the blue light. In short, dichroic mirror 112 reflects yellow light (yellow fluorescence) emitted from wavelength converter 10.

Optical unit 120 includes condenser lens 121, rod integrator 122, lens group 123, projection lens 124, and display device 125.

Condenser lens 121 collects the light from light-emitting device 110 onto the incident end surface of rod integrator 122.

Rod integrator 122 receives the light collected by condenser lens 121 at its incident end surface and emits the light with a uniform luminance distribution. Rod integrator 122, which is, for example, a square prism, repeats total reflection of the incident light in a medium and emits it as the light with a uniform luminance distribution.

Lens group 123 allows the light from rod integrator 122 to be incident on display device 125. Lens group 123 is a lens unit consisting of a plurality of lenses including, for example, a condenser lens and a relay lens.

Projection lens 124 is used for projecting the light from display device 125 to the outside of projector 100. Projection lens 124 is a projection lens group (projection unit) consisting of one or more lenses such as a biconvex lens, a diaphragm, and a plano-concave lens.

Display device 125 controls the light from lens group 123 and outputs it as images. One specific example of display device 125 is a digital mirror device (DMD) used as a video device.

Controller 130 controls light-emitting device 110 (illuminator 111 and motor 116), and display device 125. Specific examples of controller 130 include a microcomputer, a processor, and a dedicated circuit.

In the above-described projector 100, the blue light from illuminator 111 passes through dichroic mirror 112 and is incident on wavelength converter 10. In wavelength converter 10 that is being rotated by motor 116, a part of the blue light passes through substrate 11 by way of opening 11a, and another part of the blue light is converted into yellow light by phosphor layer 15.

The yellow light from phosphor layer 15 is reflected by dichroic mirror 112 and is led to optical unit 120. Meanwhile, the blue light that has passed through substrate 11 by way of opening 11a is reflected by first reflective mirror 113, second reflective mirror 114, and third reflective mirror 115 in this order. The blue light reflected by third reflective mirror 115 passes through dichroic mirror 112 and is led to optical unit 120. As a result, optical unit 120 receives white light produced from a combination of the blue light and the yellow light.

The white light incident on optical unit 120 passes through condenser lens 121, rod integrator 122, and lens group 123 in this order, and is incident on display device 125. The incident white light is formed into images (video light) based on a video signal from controller 130, and is outputted from display device 125. The images from display device 125 are projected onto a target such as a screen by projection lens 124.

As described above, the present disclosure has achieved projector 100 including wavelength converter 10. To be more specific, wavelength converter 10 with high heat resistance and high light extraction efficiency has achieved projector 100 with high heat resistance and high luminosity.

Projector 100 according to the present exemplary embodiment is just an example, and wavelength converter 10 according to the present disclosure is usable in projectors including various existing optical systems.

Second Exemplary Embodiment

Wavelength Converter 20

Figure 4:
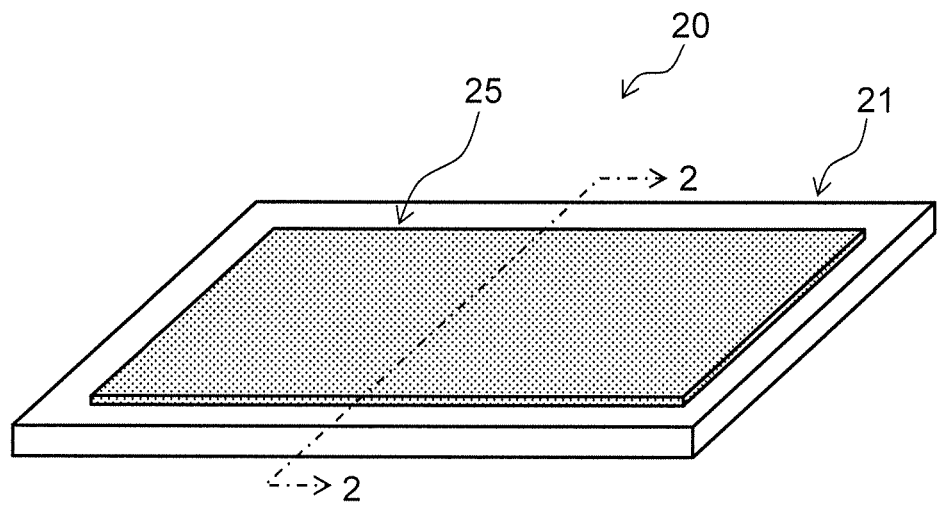
FIG. 4 is a perspective view of a wavelength converter according to a second exemplary embodiment.

FIG. 4 is a perspective view of wavelength converter 20 according to a second exemplary embodiment. In FIG. 4, wavelength converter 20 is used in a light source for lighting devices, and includes rectangular substrate 21 and phosphor layer 25 mounted on a main surface (upper surface) of substrate 21.

In FIG. 4, wavelength converter 20 is intended for lighting devices, and includes substrate 21, an adhesive layer (not shown), a reflective layer (not shown), an enhanced reflection layer (not shown), phosphor layer 25 according to the second exemplary embodiment, and an antireflective layer (not shown). Substrate 21 is rectangular and is mounted with rectangular phosphor layer 25 on a main surface. Phosphor layer 25 is composed of a sealing layer and a phosphor.

All components in wavelength converter 20 are approximately identical to those of the same names in wavelength converter 10 according to the first exemplary embodiment except for their shapes. Therefore, the description of the components will be omitted. The cross sectional view taken along line 2-2 of FIG. 4 is identical to the cross sectional view taken along line 2-2 of FIG. 1.

Phosphor layer 25 according to the second exemplary embodiment has approximately the same structure as phosphor layer 15 according to the first exemplary embodiment. Therefore, wavelength converter 20 according to the second exemplary embodiment provides effects similar to those of wavelength converter 10 according to the first exemplary embodiment described above.

Lighting Device 200

Figure 5:
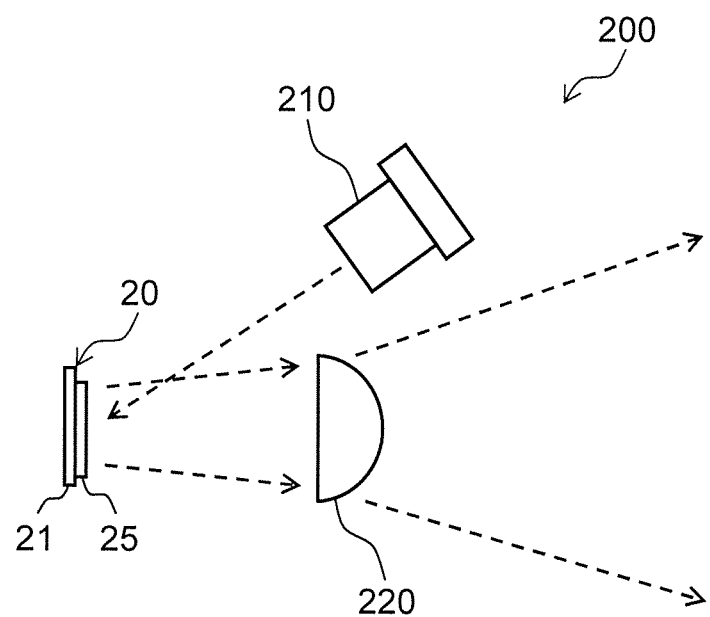
FIG. 5 is a diagram of a lighting device according to the second exemplary embodiment.

FIG. 5 is a diagram of lighting device 200 according to the second exemplary embodiment. In FIG. 5, lighting device 200 includes wavelength converter 20, solid-state light source 210, and optical system 220.

Specific examples of light source 210 include a semiconductor laser and a light emitting diode, which emit excitation light in the UV to blue light region. In the present exemplary embodiment, light source 210 is a semiconductor laser that is made of GaN-based material and emits blue light of about 460 nm.

The blue light (blue excitation light) emitted from light source 210 to wavelength converter 20 is partly converted into yellow light (yellow fluorescence) by phosphor layer 25. The yellow light from layer 25 and the blue light that has not converted by layer 25 are mixed and emitted as white light from wavelength converter 20. The white light is emitted as illumination light from optical system 220.

As described above, the present disclosure has achieved lighting device 200 including wavelength converter 20. To be more specific, wavelength converter 20, which includes phosphor layer 25 with high wavelength conversion efficiency has achieved lighting device 200 with high luminosity.

Modified Example

The wavelength converters, projectors, and lighting devices according to the first and second exemplary embodiments have been described as above. However, the present disclosure is not limited to these embodiments, and includes any modifications that person skilled in the art may think of as long as they do not greatly deviate from the spirit of the present disclosure.

For example, in the first and second exemplary embodiments, the wavelength converters are intended for use in projectors and lighting devices; however, they may alternatively be used in displays and other devices.

The wavelength converters according to the first and second exemplary embodiments have the laminated structure shown in FIG. 2; however, other additional layers may be contained in the structure as long as the laminated structure provides similar functions.

The first and second exemplary embodiments have described only main materials of each layer of the laminated structure. Each layer can contain other additional materials as long as the laminated structure provides similar functions.

The wavelength converters according to the present disclosure can be widely used in devices that use wavelength-converted light, such as projectors and lighting devices.

REFERENCE MARKS IN THE DRAWINGS 10, 20 wavelength converter
11, 21 substrate
11a opening
12 adhesive layer
13 reflective layer
14 enhanced reflection layer
14a low refractive layer
14b high refractive layer
15, 25 phosphor layer
15a sealing layer
15b phosphor
16 antireflective layer
16a first low-refractive layer
16b high refractive layer
16c second low-refractive layer
100 projector
110 light-emitting device
111 illuminator
111a, 210 solid-state light source
111b collimator lens
111c heat sink
112 dichroic mirror
113 first reflective mirror 114 second reflective mirror
115 third reflective mirror
116 motor
120 optical unit
121 condenser lens
122 rod integrator
123 lens group
124 projection lens
125 display device
130 controller
200 lighting device
220 optical system

What is claimed is:

1. A wavelength converter comprising, in sequence: a substrate, a reflective layer, and a phosphor layer, the phosphor layer comprising:
a sealing layer comprising a hybrid material comprising a glass component and a resin component; and
a phosphor dispersed in the sealing layer.

2. The wavelength converter according to claim 1, wherein the hybrid material contains at least 98wt % of a combination of the glass component and the resin component.

3. The wavelength converter according to claim 1, wherein the glass component comprises either silica glass with a Si—O structure or phosphate glass with a P—O bond.

4. The wavelength converter according to claim 1, wherein the resin component comprises a silicone resin with a Si—O structure.

5. The wavelength converter according to claim 1, wherein the hybrid material contains, as a residue, a hydrolyzed silicon alkoxide compound.

6. A projector comprising the wavelength converter according to claim 1.

7. A lighting device comprising the wavelength converter according to claim 1.

* * * * *